United States Patent [19]

Hsu

[11] Patent Number: 6,083,807
[45] Date of Patent: Jul. 4, 2000

[54] OVERLAY MEASURING MARK AND ITS METHOD

[75] Inventor: Chungwei Hsu, Taipei, Taiwan

[73] Assignee: Nanya Technology Corporation, Taiwan

[21] Appl. No.: 09/365,736

[22] Filed: Aug. 3, 1999

[30] Foreign Application Priority Data

Mar. 29, 1999 [TW] Taiwan .................................. 88104911

[51] Int. Cl.[7] .................................................. H01L 21/76
[52] U.S. Cl. ........................... 438/401; 438/800; 257/797
[58] Field of Search ..................................... 438/401, 462,
438/800; 257/797, 800; 365/401

[56] References Cited

U.S. PATENT DOCUMENTS 4,595,295  6/1986  Wilczynski ............................. 356/401

*Primary Examiner*—Charles Bowers
*Assistant Examiner*—Craig Thompson
*Attorney, Agent, or Firm*—George T. Marcou; Kilpatrick Stockton LLP

[57] ABSTRACT

This invention discloses an overlay measuring mark and a method of measuring an overlay error of semiconductor used by the overlay measuring mark. This overlay measuring mark comprises a first mark formed on a first layer on a semiconductor substrate and including four bar sets, which form a first square pattern, each of said bar sets at least comprising two parallel bars relatively formed by a first slim pattern; and a second mark formed on a second layer on said first layer and including four bar formed a second square pattern, wherein said four bar relatively are formed by a second slim pattern and said second square is located in and smaller than said first square in a top view.

10 Claims, 3 Drawing Sheets

OVERLAY MEASURING MARK AND ITS METHOD

BACKGROUND OF THE INVENTION

1. Field of the Invention

The present invention generally relates to an overlay measuring mark and its method. Specially, it relates to an overlay measuring mark and a method of measuring an overlay error between multi patterns in a semiconductor device using the overlay measuring mark.

2. Description of Related Art

As integrated circuit processing becomes more and more precise and the dimension of the various circuit alignment of each process layer to preceding process layers becomes greater. In order to facilitate alignment of the various process layers, small alignment images are typically included in the photomasks used to photolithigraphically produce each layer, with each such image being intended to produce on the wafer substrate an alignment attribute which a corresponding attribute of a subsequent layer can be aligned.

Generally, a semiconductor device is fabricated by complicated process wherein a plurality of light-exposure masks are repeatedly aligned by a stepper. The stepper, which is limited light-exposing apparatus operable in a step-and-repeat manner repeatedly moves a stage in a x-y direction so as to align the masks prior to exposure to light. By means of the stepper, a wafer is aligned in a manual or automatic manner on the basis of an alignment mark or called overlay measuring mark. At the moment, an error may be generated by mechanical motion of the stage during alignment. If this alignment error exceeds an allowable limit, a defect may be generated in the semiconductor device.

Usually, an overlay measuring mark, involving an upper mark which is overlapped with a lower mark, measures alignment error. The control range of overlay accuracy for misalignment acts on the design rule of the semiconductor device and is typically in a range of 20 to 30%. The measurement of misalignment using alignment marks is carried out in accordance with either a visual checking method using vernier alignment marks or an automatic checking method using box-in-box or box-in-bar alignment marks. The misalignment is compensated based on the result of the measurement.

FIG. 1 and FIG. 2 show an inner and an outer masks combined to form an overlap measuring masks by light exposure masks in the prior art. FIG. 3 shows the overlap measuring masks implemented on the wafer to measure alignment error.

In FIG. 1, a light exposure mask 1 comprises a transparent part 2 and an obscure part 3 used to generate the outer mask. And in FIG. 2, a light exposure mask 11 comprises a transparent part 12 and an obscure part 13 used to generate the inner mask.

In FIG. 3, an etch layer with on a wafer substrate 21 is provided. The light exposure mask 1 is first used as a pattern to etch the etch layer, thereby an outer mark 22 in FIG. 3 is formed. By the same method, the light exposure mask 11 is next used as a pattern to etch the rest etch layer, thereby an inner mark 23 in FIG. 3 is formed.

At this moment, reference points on the inner and outer mark 23 and 22 on the substrate 21 can measure alignment error. In general, overlay measurement is applied in wafer fabricating processes to estimate alignment error between two or more patterns on different layers. FIG. 4 and FIG. 5 illustrate a prior art method of measuring an overlay error of multi patterns.

An overlay measurement mark is formed on a scribe line of a wafer using a plurality of masks, with the masks identical to the one used in the formation of patterns on a product die of the wafer. As shown in FIG. 5 to form overlay measuring marks according to the lay-out of FIG. 4, an outer measuring mark 51 corresponding to the conductive region H of FIG. 4 is formed on a scribe line (not shown) using a pattern mask. And after that, an inner overlay measuring mark 52 corresponding to contact regions F and G of FIG. 4 is formed on the scribe line using a contact mark, with the inner mark 52 forming from the inside the outer mark 1. The outer mark 1 is formed with conductive material while the inner mark 52 is formed with photoresist.

In the overlay measurement method, distance A and A' between the two marks 51 and 52 are measured as a degree of overlay in the x-axis, and the difference A–A' between the two distance is taken as an overlay error in the x-axis. Similarly, distance B and B' between the two marks 51 and 52 are measured as a degree of overlay in the y-axis, and the difference B–B' between the two distances is taken as an overlay error in the y-axis.

However, the overlay error created by the conventional overlay measuring marks can not be available with more precision in semiconductor fabrication at these times. Since the size of the overlay measuring marks is larger than ten times of the size of the elements on fabricated wafer, the overlay error measured from the conventional overlay measuring marks can not show real and slight overlay error between different layers. For example based on the outer mark 22 in FIG. 3, the edge of the outer mark 22 is 30 um×30 um and in general such outer mark is used in 0.3 um semiconductor fabrication. If the desired size of elements on wafers is reduced, i.e. smaller than 0.3 um, the slight overlay error can not be measured since the resolution of optical devices or the recognition ability of human eyes is limited to tell such slight overlay error. Namely, the conventional outer mark 22 and inner mark 23 in FIG. 3 will not be suit for smaller than 0.3 um semiconductor fabrication.

SUMMARY OF THE INVENTION

It is therefore an object of the present invention to provide an overlay measuring mark and its measuring method used to measure overlay error between multi overlapped layers. With respect to the present invention, the alignment of overlay measurement can be improved during semiconductor fabrication and the differential distances between the marks of multi layers can be more credible.

In the preferred embodiment with respect to the present invention, the same size as the conventional marks is applied but the marks are divided to several subsections. Since the conventional overlay measuring marks are about few um to 50 um and too much larger than elements whose size is about more less than 0.3 um on the wafer to reflect overlay error, an important concept of the present invention is to provide an overlay measuring mark whose size can more accurately reflect the overlay error between multi layers to fabricate more precise elements on the wafer.

The overlay measuring mark with respect to the present invention comprises a first mark formed on a first layer on a semiconductor. substrate and including four bar sets, which form a first square pattern, each of said bar sets at least comprising two parallel bars relatively formed by a first slim pattern; and a second mark formed on a second layer on said first layer and including four bar formed a second square pattern, wherein said four bar relatively are formed by a second slim pattern and said second square is located in and smaller than said first square in a top view.

The method of measuring overlay error by the overlay measuring mark comprises the following steps: provide a semiconductor substrate; form a first mark on a first layer on said semiconductor substrate including four bar sets, which form a first square pattern, each of said bar sets at least comprising two parallel bars relatively formed by a first slim pattern; form a second mark on a second layer on said first layer including four bar formed a second square pattern, wherein said four bar relatively are formed by a second slim pattern and said second square is located in and smaller than said first square in a top view; and finally measure a distance between two central positions of said first square and said second square as an overlay error.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 1:
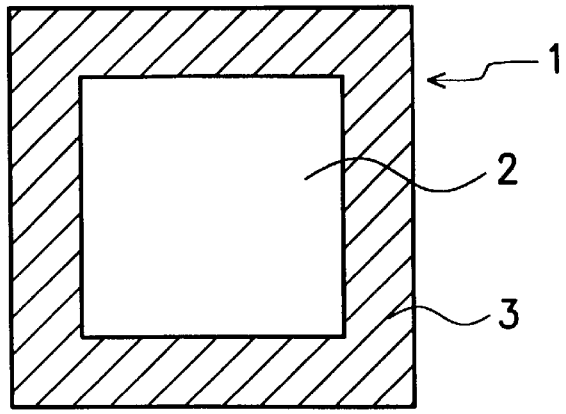
FIG. 1 and FIG. 2 show an inner and an outer masks combined to form an overlap measuring masks by light exposure masks in the prior art.
Figure 2:
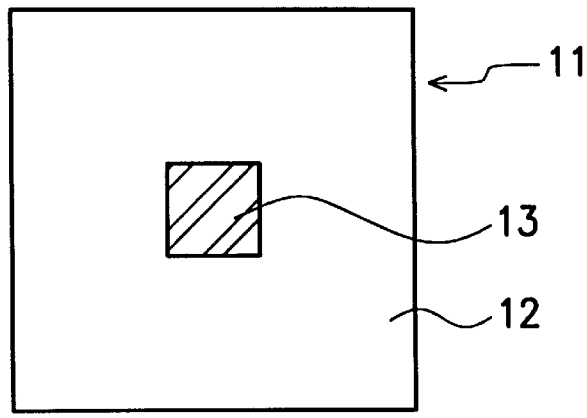
Figure 3:
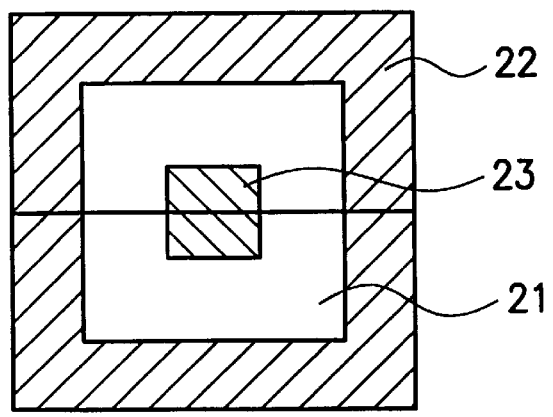
FIG. 3 shows the overlap measuring masks implemented on the wafer to measure alignment error.
Figure 4:
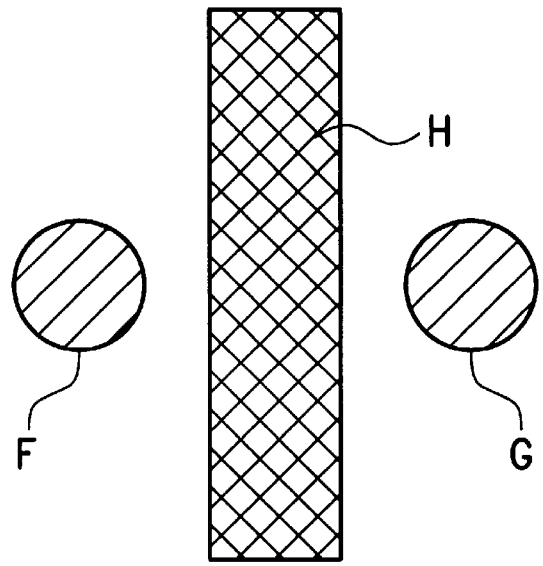
FIG. 4 and FIG. 5 illustrate a prior art method of measuring an overlay error of multi patterns.
Figure 5:
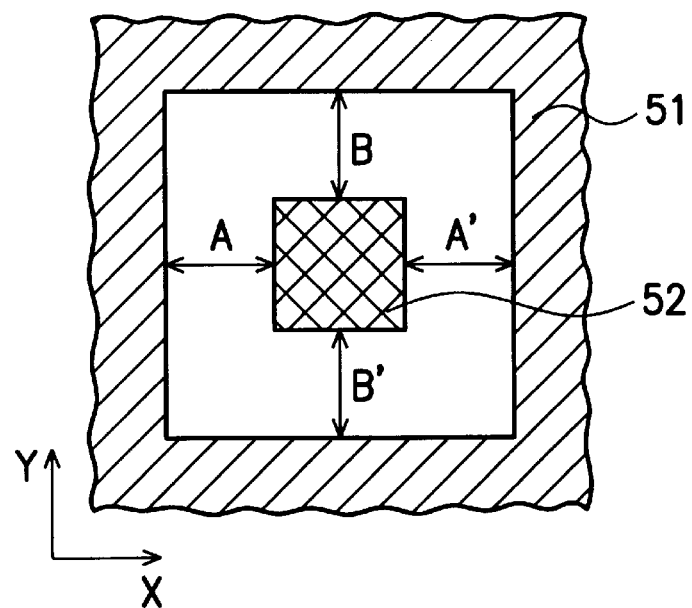
Figure 6:
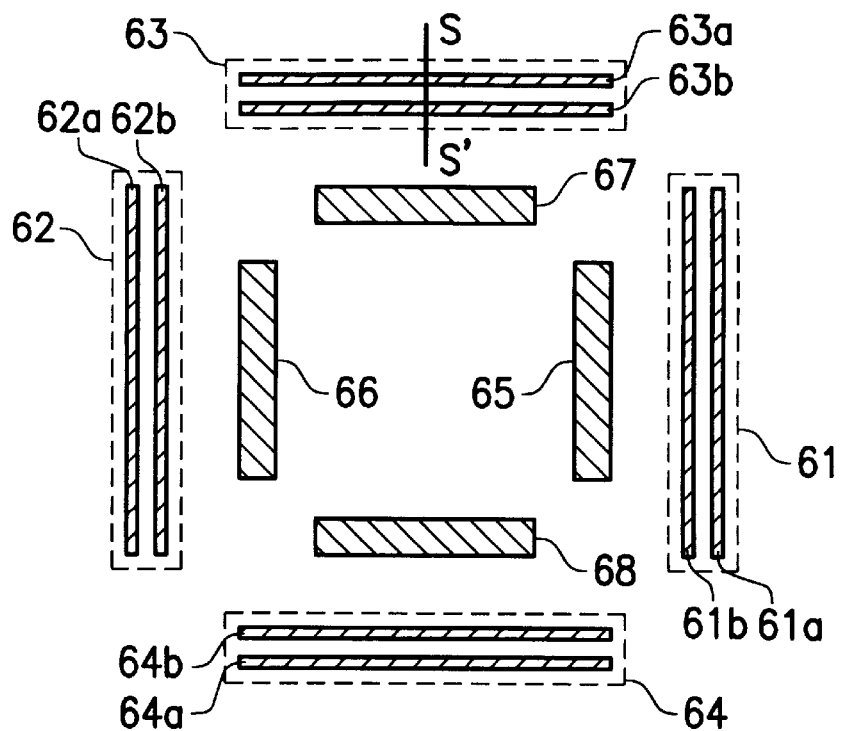
FIG. 6 is a top view of the overlay measuring mark of the preferred embodiment with respect to the present invention.

Referring to FIG. 6, the preferred embodiment in accordance with the present invention is illustrated. Each edge of the outer mark of the overlay measuring mark, i.e. 61~64, comprises two bars, i.e. 61a, 61b, 62a, 62b, 63a, 63b, and 64a, 64b, relatively. Each bar of the inner mark of the overlay measuring mark, i.e. 65~68, is about 1 um×3 um to 3 um×10 um. The outer mark and the inner mark are formed relatively on different layers on a semiconductor substrate. It is obvious that the formation of the outer mark of the preferred embodiment is different to the conventional one. Each edge of the outer mark with respect to the present invention may comprise multi parallel bars. In the preferred embodiment, each edge of the outer mark has two bars whose size is about 0.2 um×10 um to 0.3 um×20 um. It is noted that the bar marks applied for the preferred embodiment are slimmer than the conventional overlay measuring mark and each edge of the outer mark has multi bars.

As described above, to obtain a more accurate overlay error, slimmer bars are applied to form the new outer mark. In the preferred embodiment of the present invention, each edge of the conventional outer mark is divided into eight slim bars, i.e. 61a, 61b, 62a, 62b, 63a, 63b, and 64a, 64b. Therefore, the width of each slim bar is about 0.2 um to 0.3 um used to more truly reflect the real size of elements on a wafer.

Figure 7:
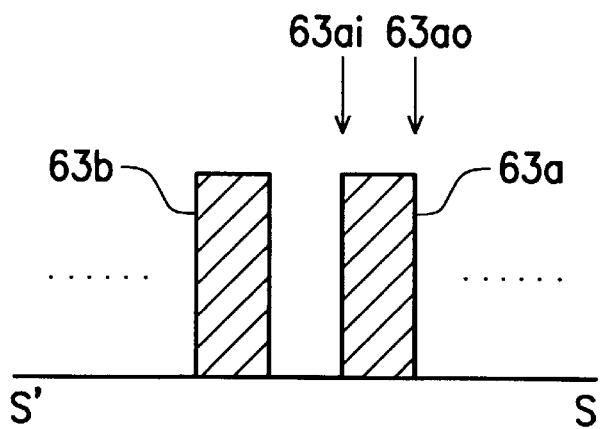
FIG. 7 is a cross-sectional view aligned with S–S' in FIG. 6.

FIG. 7 illustrates a cross section view along line S–S' in FIG. 6. The width of the slim bar 63a (from edge 63ai to 63ao) is same to the width of the slim bar 63b about to 0.3 um. The distance between these two bars 63a and 63b is about 0.2 um to 0.3 um.

In fact, the number of slim bars can be increased, but the increase may not help significantly to measure overlay error.

Table 1 and Table 2 show the proof based on different number of slim bars with different bar width. In Table 1, the width of the slim bar is about 0.3 um and in table 2 the width of the slim bar is about 0.2 um. A SEM (scanning electron microscope) is used to measure overlay error. The width difference is a difference of a width of the most left bar from a width of the most right bar. The Coma value is (a difference of a width of the most left bar from a width of the most right bar)/(a sum of a width of the most left bar and a width of the most right bar).

TABLE 1

| Number of slim bars | Width of the most left bar (um) | Width of the most right bar (um) | Width difference ($\mu$m) | Coma value |
|---|---|---|---|---|
| 5 | 0.307 | 0.313 | −0.006 | −0.010 |
| 4 | 0.318 | 0.315 | 0.003 | 0.005 |
| 3 | 0.313 | 0.318 | −0.005 | −0.008 |
| 2 | 0.307 | 0.315 | −0.008 | −0.013 |

TABLE 2

| Number of slim bars | Width of the most left bar (um) | Width of the most right bar (um) | Width difference ($\mu$m) | Coma value |
|---|---|---|---|---|
| 5 | 0.236 | 0.252 | −0.016 | −0.033 |
| 4 | 0.214 | 0.228 | −0.014 | −0.032 |
| 3 | 0.209 | 0.225 | −0.016 | −0.037 |
| 2 | 0.222 | 0.238 | −0.016 | −0.035 |

The width difference in Table 1 or 2 actually shows representative overlay error. Besides, it is noted that the number of slim bars causes no effect on the Coma value, so the result of overlay error measurement with respect to the present invention is independent of the number of slim bars. Furthermore, in Table 1, the width of each slim bar is about 0.3 um and the width difference is relative smaller. On the other hand, in Table 2, the width of each slim bar is smaller than the one in Table 1 about 0.2 um but the width difference is lager than the one in Table 1. That means the effect of alignment error in Table 2 is relatively enlarged. It is significant that if the size of elements of semiconductor is more reduced, e.g. from 0.3 um to 0.2 um, the conventional overlay measuring mark with a larger size can not further illustrate fine alignment error.

After the outer and inner marks has been formed, measure overlay error and then feed back this error to a stepper as a data of adjusting next alignment. First, measure the central positions of the outer and inner marks in vertical and horizontal direction. Because the number of slim bars causes no effect on the result of the overlay error measurement, the central position of the outer mark can be measured from the outer edge of slim bar 62a to 61a and from the outer edge of slim bar 64a to 63a. Another reason of applying the outer edges to measure the central position is that for the optical detector, the signal waveform caused by an outer edge of a slim bar is clearer and more significant than by an inner edge to detect a correct position. This correct position of the outer edge of the outer bar can provide an accurate central position of the outer mark. The central position of the inner mark formed by bar 65~68 can be measured by the same way described above. Thereafter, the overlay error can be measured by a difference between the central positions of the outer mark and the inner mark. Then the stepper can apply this overlay error to adjust the next alignment.

The foregoing description of preferred embodiments of the present invention has been provided for the purposes of illustration and description. It is not intended to be exhaustive or to limit the invention to the precise forms disclosed. The embodiments were chosen and described to best explain the principles of the invention and its practical application, thereby enabling others skilled in the art to understand the invention and to practice various other embodiments and make various modifications suited to the particular use contemplated. It is intended that the following claims or their equivalents define the scope of the invention.

What is claimed is:

1. An overlay measuring mark used to measure an overlay error caused in semiconductor fabrication, comprising:

a first mark formed on a first layer on a semiconductor substrate and including four bar sets, which form a first square pattern, each of said bar sets at least comprising two parallel bars relatively formed by a first slim pattern; and a second mark formed on a second layer on said first layer and including four bar formed a second square pattern, wherein said four bar relatively are formed by a second slim pattern and said second square is located in and smaller than said first square in a top view.

2. The overlay measuring mark of claim 1, wherein a width of each of said two parallel bars is about 0.2 um to 0.3 um and a distance between said two parallel bars is about 1 um to 3 um.

3. The overlay measuring mark of claim 1, wherein a width of each of said four bars of said second mark is about 1 um to 3 um.

4. The overlay measuring mark of claim 1, wherein a length of each of said two parallel bars is about 10 um to 20 um.

5. The overlay measuring mark of claim 1, wherein a length of each of said four bars of said second mark is about 3 um to 8 um.

6. A method of measuring an overlay error in semiconductor fabrication comprising:

providing a semiconductor substrate;

forming a first mark on a first layer on said semiconductor substrate including four bar sets, which form a first square pattern, each of said bar sets at least comprising two parallel bars relatively formed by a first slim pattern;

forming a second mark on a second layer on said first layer including four bar formed a second square pattern, wherein said four bar relatively are formed by a second slim pattern and said second square is located in and smaller than said first square in a top view; and measuring a distance between two central positions of said first square and said second square as an overlay error.

7. The method of claim 6, wherein a width of each of said two parallel bars is about 0.2 um to 0.3 um and a distance between said two parallel bars is about 1 um to 3 um.

8. The method of claim 6, a width of each of said four bars of said second mark is about 1 um to 3 um.

9. The method of claim 6, a length of each of said two parallel bars is about 10 um to 20 um.

10. The method of claim 6, wherein a length of each of said four bars of said second mark is about 3 um to 8 um.

* * * * *